United States Patent
Holmes et al.

(10) Patent No.: US 11,349,061 B2
(45) Date of Patent: May 31, 2022

(54) GLASSY CARBON MASK FOR IMMERSION IMPLANT AND SELECTIVE LASER ANNEAL

(71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US); Brent A. Wacaser, Putnam Valley, NY (US); Damon Brooks Farmer, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 19 days.

(21) Appl. No.: 16/895,997

(22) Filed: Jun. 8, 2020

(65) Prior Publication Data

US 2021/0384405 A1    Dec. 9, 2021

(51) Int. Cl.
*H01L 39/24* (2006.01)
*H01L 39/12* (2006.01)

(52) U.S. Cl.
CPC .............. *H01L 39/24* (2013.01); *H01L 39/12* (2013.01)

(58) Field of Classification Search
CPC ............................. H01L 39/025; H01L 39/24
See application file for complete search history.

(56) References Cited

U.S. PATENT DOCUMENTS

| | | | |
|---|---|---|---|
| 5,362,662 A * | 11/1994 | Ando | H01L 27/112 438/290 |
| 6,040,019 A * | 3/2000 | Ishida | H01L 27/11521 257/E21.336 |
| 8,138,105 B2 | 3/2012 | Timans | |
| 8,143,630 B2 | 3/2012 | Wang | |
| 8,426,309 B2 | 4/2013 | Ward et al. | |
| 8,796,741 B2 | 8/2014 | Gu et al. | |
| 9,299,939 B1 | 3/2016 | Cao et al. | |
| 9,487,869 B2 | 11/2016 | Majetich et al. | |
| 2005/0079448 A1 | 4/2005 | Nakada et al. | |

(Continued)

FOREIGN PATENT DOCUMENTS

WO    2013115570 A1    8/2013

OTHER PUBLICATIONS

Sharma et al., "Glassy Carbon: A Promising Material for Micro and Nano-manufacturing", Material 218, 11, 1857, pp. 1-21.

(Continued)

*Primary Examiner* — Jae Lee
(74) *Attorney, Agent, or Firm* — Henry J. Daley; Venable LLP

(57) ABSTRACT

According to an embodiment of the present invention, a method of producing a computing device includes providing a semiconductor substrate, and patterning a mask on the semiconductor substrate, the mask exposing a first portion of the semiconductor substrate and covering a second portion of the semiconductor substrate. The method includes implanting the first portion of the semiconductor substrate with a dopant. The method includes annealing the first portion of the semiconductor substrate to form an annealed doped region, while maintaining the second portion of the semiconductor substrate as an unannealed portion.

21 Claims, 6 Drawing Sheets

(56) References Cited

U.S. PATENT DOCUMENTS

| | | | |
|---|---|---|---|
| 2006/0124050 A1* | 6/2006 | Tarrant | C30B 9/00 |
| | | | 117/19 |
| 2009/0108412 A1 | 4/2009 | Itokawa et al. | |
| 2014/0306267 A1* | 10/2014 | Kameyama | H01L 29/7397 |
| | | | 257/140 |
| 2018/0247823 A1* | 8/2018 | LaBrake | H01L 21/02282 |
| 2021/0074807 A1* | 3/2021 | Tang | H01L 29/456 |
| 2021/0226114 A1* | 7/2021 | Holmes | H01L 39/2487 |

OTHER PUBLICATIONS

Grockowiak et al., "Superconductor Science and Technology", 26, (2013), 045009, (4pp).

Hoummada et al., "Absence of boron aggregates in superconducting silicon confirmed by atom probe tomography", Applied Physics Letters, 101, 182602 (2012).

Chiodi et al., "All silicon Josephson junctions", arXiv:1610.08453v1 [cond-mat.mes-hall] Oct. 26, 2016.

Shim et al., "Bottom-up superconducting and Josephson junction devices inside a group-IV semiconductor", Nature Communications, 5:4225, DOI: 10.1038/ncomms/5225.

\* cited by examiner

US 11,349,061 B2

GLASSY CARBON MASK FOR IMMERSION IMPLANT AND SELECTIVE LASER ANNEAL

BACKGROUND

The currently claimed embodiments of the present invention relate to computing devices, and more specifically, to methods for producing computing devices using selective laser annealing.

Plasma immersion annealing can be used to form Si superconducting films. These films can be used to make Josephson junction and qubit devices that are useful for quantum computing. However, current mask layers used for immersion implantation are unable to serve as an optical mask during the laser-anneal step.

SUMMARY

According to an embodiment of the present invention, a method of producing a computing device includes providing a semiconductor substrate, and patterning a mask on the semiconductor substrate, the mask exposing a first portion of the semiconductor substrate and covering a second portion of the semiconductor substrate. The method includes implanting the first portion of the semiconductor substrate with a dopant. The method includes annealing the first portion of the semiconductor substrate to form an annealed doped region, while maintaining the second portion of the semiconductor substrate as an unannealed portion.

According to an embodiment of the present invention, a computing device includes a semiconductor substrate. The semiconductor substrate includes an annealed doped region formed in the semiconductor substrate, and a non-superconducting region in the semiconductor substrate proximal to the annealed doped region. The annealed doped region has a dopant that is implanted by annealing, and the non-superconducting region has a structure that is unaltered by annealing.

DETAILED DESCRIPTION

A mask layer that can serve both as a mask for immersion implantation and also as an optical mask during the laser-anneal step must be highly stable thermally and highly absorbing to mask the laser illumination. The mask must also be easily patterned without damage to the Si wafer and have good adhesion to the Si during the thermal annealing. Some embodiments of the invention are directed to a mask, and methods of using a mask, that has these qualities.

Standard chemical symbols for silicon (Si), boron (B), aluminum (Al), argon (Ar), gallium (Ga), germanium (Ge), tantalum (Ta), titanium (Ti), oxygen (O), nitrogen (N), hydrogen (H), tungsten (W), zinc (Zn), and chlorine (Cl) are used throughout this description.

Figure 1:
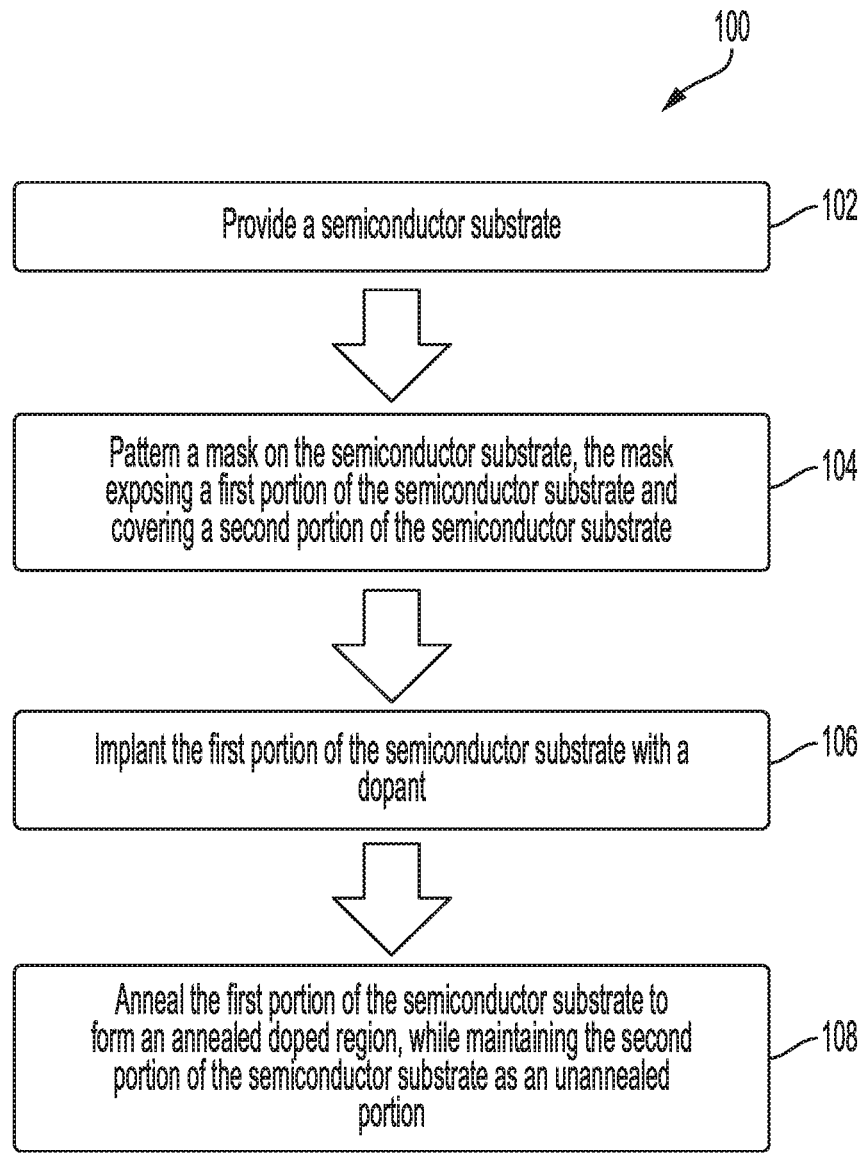
FIG. 1 is a flowchart illustrating a method of producing a computing device according to an embodiment of the present invention.

FIG. 1 is a flowchart illustrating a method 100 of producing a computing device according to an embodiment of the present invention. The method 100 includes providing a semiconductor substrate 102. The method 100 includes patterning a mask on the semiconductor substrate 104 such that the mask exposes a first portion of the semiconductor substrate and covers a second portion of the semiconductor substrate. The method 100 includes implanting the first portion of the semiconductor substrate with a dopant 106. The method 100 includes annealing the first portion of the semiconductor substrate to form an annealed doped region, while maintaining the second portion of the semiconductor substrate as an unannealed portion 108.

According to an embodiment of the present invention, patterning the mask on the semiconductor substrate 104 includes depositing a layer of mask material on the semiconductor substrate, and removing a portion of the layer of mask material to pattern the mask.

According to an embodiment of the present invention, the mask comprises glassy carbon. According to an embodiment of the present invention, the semiconductor substrate comprises Si. According to an embodiment of the present invention, the annealed doped region comprises superconducting Si. According to an embodiment of the present invention, the superconducting Si comprises Si implanted with B. According to an embodiment of the present invention, the annealed doped region has a crystalline structure. According to an embodiment of the present invention, the computing device is a quantum computing device.

According to an embodiment of the present invention, annealing the first portion 108 comprises laser annealing the first portion. According to an embodiment of the present invention, the mask absorbs a frequency of a laser used for the laser annealing. According to an embodiment of the present invention, the mask is physically stable at 900° C. For example, the mask according to an embodiment shrinks less than 10% at 900° C.

The method 100 according to an embodiment of the present invention includes, prior to forming the mask on the semiconductor substrate, forming a region of thermally-sensitive material on the semiconductor substrate, wherein patterning the mask comprises covering the region of thermally-sensitive material with the mask.

Figure 2:
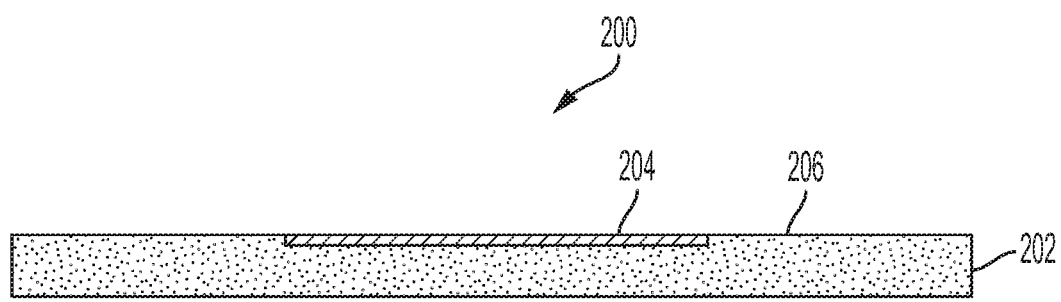
FIG. 2 is a schematic illustration of a computing device according to an embodiment of the present invention.

FIG. 2 is a schematic illustration of a computing device 200 according to an embodiment of the present invention. The computing device 200 includes a semiconductor substrate 202. The semiconductor substrate 202 includes an annealed doped region 204 formed in the semiconductor substrate 202, and a non-superconducting region 206 in the semiconductor substrate 202 proximal to the annealed doped region 204. The annealed doped region 204 has a dopant that is implanted by annealing, and the non-superconducting region 206 has a structure that is unaltered by annealing.

According to an embodiment of the present invention, the semiconductor substrate 202 comprises Si. According to an embodiment of the present invention, the annealed doped region 204 is a superconducting region. According to an embodiment of the present invention, the annealed doped region 204 comprises superconducting Si. According to an embodiment of the present invention, the superconducting Si comprises Si implanted with B.

According to an embodiment of the present invention, the annealed doped region 204 has a crystalline structure. According to an embodiment of the present invention, the non-superconducting region 206 has a crystalline structure.

Figure 3:
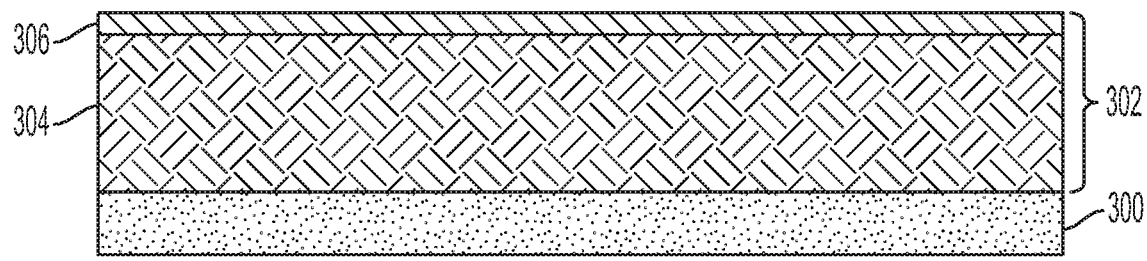
FIG. 3 is a schematic illustration of a semiconductor substrate with a glassy carbon lithography stack formed thereon according to an embodiment of the present invention.

FIGS. 3-9 illustrate an example process for producing a computing device according to an embodiment of the present invention. The process includes depositing a glassy carbon lithography stack on a semiconductor substrate. FIG. 3 is a schematic illustration of a semiconductor substrate 300 with a glassy carbon lithography stack 302 formed thereon. The glassy carbon lithography stack 302 includes a glassy carbon layer 304 and a hard mask 306 deposited on the glassy carbon layer 304. The hard mask may include, for example, Ti. The glassy carbon layer 304 is engineered to strongly absorb laser-anneal light, preventing it entirely from reaching the semiconductor substrate surface in regions which are covered by the glassy carbon layer 304.

Figure 4:
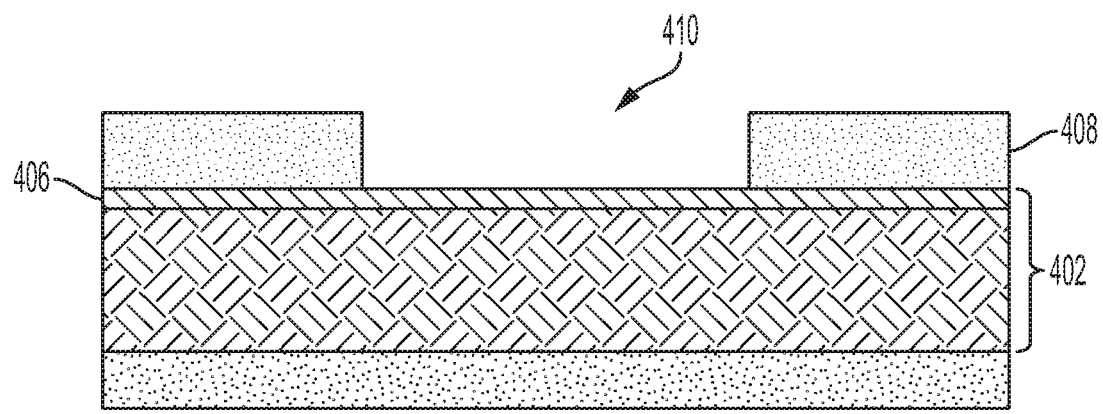
FIG. 4 is a schematic illustration of a patterned resist on a glassy carbon lithography stack according to an embodiment of the present invention.

The process includes depositing a resist on the hard mask and patterning the resist to define regions for annealing. FIG. 4 is a schematic illustration of a patterned resist 408 on a glassy carbon lithography stack 402. The patterned resist 408 defines a hole 410 where the hard mask 406 is exposed. The resist may be a commercially available resist.

Figure 5:
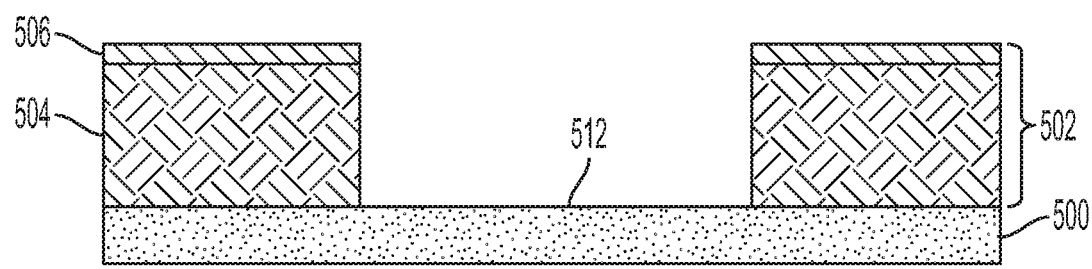
FIG. 5 is a schematic illustration of the glassy carbon lithography stack after etching according to an embodiment of the present invention.

The process includes etching the glassy carbon lithography stack to expose a surface of the semiconductor substrate. FIG. 5 is a schematic illustration of the glassy carbon lithography stack 502 after etching. A surface 512 of the semiconductor substrate 500 is exposed. The etching process may include a reactive ion etch (REI), for example, using chlorine plasma, to remove hard mask 506 exposed by the patterned resist. The etching process may also include a hydrogen peroxide wet etch that strips the resist and etches the glassy carbon layer 504 at the same time.

Figure 6:
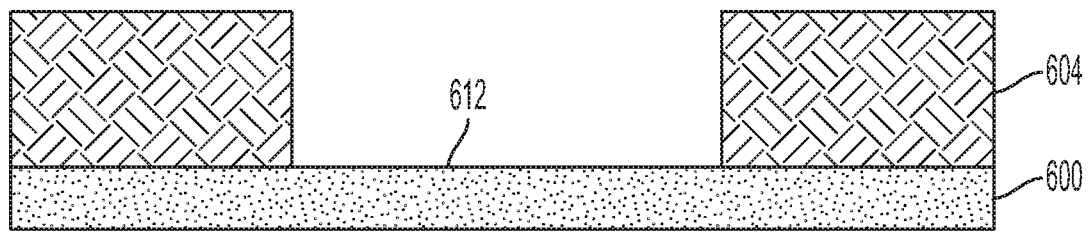
FIG. 6 is a schematic illustration of the semiconductor substrate and glassy carbon layer after the hard mask has been removed according to an embodiment of the present invention.

The process includes stripping the hard mask and cleaning the exposed surface of the semiconductor substrate. FIG. 6 is a schematic illustration of the semiconductor substrate 600 and glassy carbon layer 604 after the hard mask has been removed. The exposed surface 612 may be cleaned, for example, using dilute hydrofluoric acid (DHF) or a wet hydrogen peroxide etch. The surface 612 may be cleaned to remove an oxide layer, such as silicon oxide, formed on the semiconductor substrate.

Figure 7:
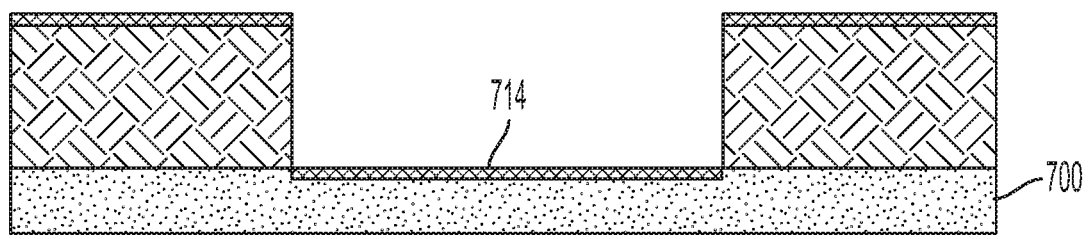
FIG. 7 is a schematic illustration of an implanted region of the semiconductor substrate according to an embodiment of the present invention.

The process includes implanting the exposed region of the semiconductor substrate with a dopant. FIG. 7 is a schematic illustration of an implanted region 714 of the semiconductor substrate 700. The semiconductor substrate 700 may be implanted, for example, by plasma immersion implantation. For a Si substrate, the semiconductor substrate 700 may be implanted with B by plasma immersion implantation to 4-8% B. The implanted region 714 may have a depth of about 10 nm. According to some embodiments, the semiconductor substrate 700 is an Si substrate, and the implanted region 714 may include Ga-doped Si. According to some embodiments, the semiconductor substrate is a Ge substrate, and the implanted region 714 includes Ga-doped Ge or Al-doped Ge.

Figure 8:
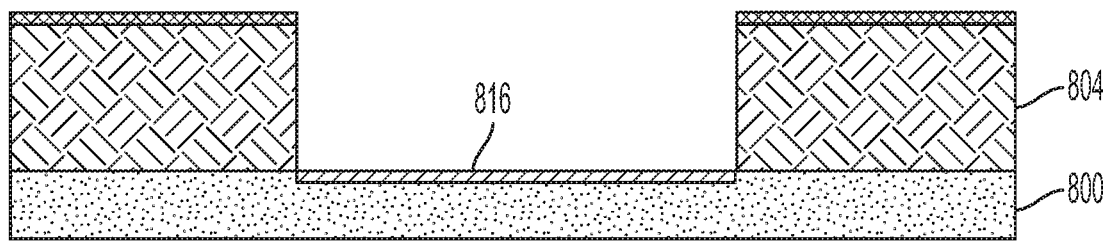
FIG. 8 is a schematic illustration of the semiconductor substrate with an annealed doped region formed therein according to an embodiment of the present invention.

The process includes laser annealing the implanted region. FIG. 8 is a schematic illustration of the semiconductor substrate 800 with an annealed doped region 816 formed therein. The annealed doped region 816 is recrystallized. According to some embodiments, the annealed doped region 816 is active as a superconductor. Damage to the non-implanted regions of the semiconductor substrate 800 during the laser annealing are avoided by use of the glassy carbon mask. Only the exposed regions of the semiconductor substrate 800 experience the laser anneal. The regions to either side of the annealed doped region 816 are covered by the glassy carbon layer 804, and thus are unaltered by the annealing. The annealed doped region 816 may have a depth of about 10 nm, and may act as a superconducting wire, a portion of a qubit, or another computing or quantum computing structure.

Figure 9:
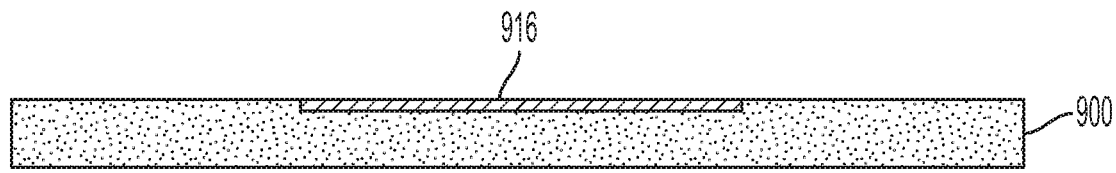
FIG. 9 is a schematic illustration of the semiconductor substrate with the annealed doped region formed therein, after the glassy carbon layer has been removed according to an embodiment of the present invention.

The process includes stripping the glassy carbon layer. FIG. 9 is a schematic illustration of the semiconductor substrate 900 with the annealed doped region 916 formed therein, after the glassy carbon layer has been removed. The glassy carbon layer may be stripped using, for example, $O_2$ or $N_2/H_2$ plasma.

According to some embodiments, a thin layer of $ZnO2$ may be deposited under the glassy carbon layer to allow the glassy carbon layer to be removed by lift off in dilute HCl rather than stripped with plasma.

Silicon oxide or other hard mask may be used in place of glassy carbon. It can function to block the immersion ion implant, and can be stripped with DHF, perhaps less damaging to the Si surface than plasma strip. However, the laser anneal would pass through the oxide and melt the Si below, perhaps causing unwanted crystal defects and/or lateral dopant migration. The carbon is a strong absorber and can block the laser anneal.

A metallic, reflective layer may be put on top of the oxide to avoid anneal under the oxide. For example, a layer of Ti, Ta, or W or similar material stable at high temperatures during the anneal could be placed on top of the oxide. A layer of Ti, Ta, or W or similar material stable at high temperatures during the anneal could be placed over the glassy carbon as well. However, a Ti layer could result in possible Ti contamination of the Si superconductor region. A $ZnO_2$ underlayer would work well perhaps in this case, as after the anneal the entire lithography stack could be lifted off during dilute HCl etch of the $ZnO_2$ layer.

Figure 10:
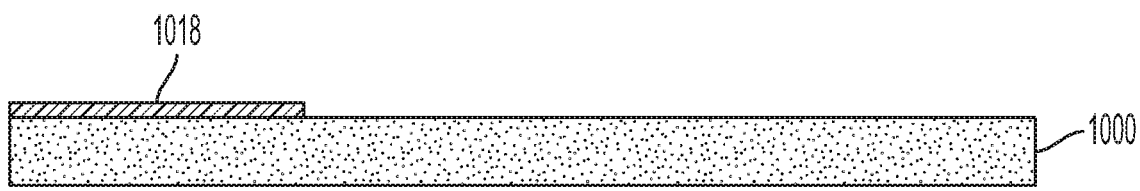
FIG. 10 is a schematic illustration of a region of thermally-sensitive material formed on the semiconductor substrate according to an embodiment of the present invention.
Figure 11:
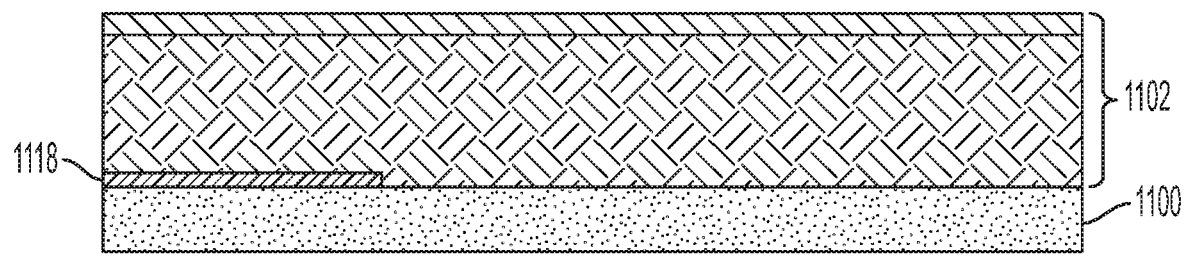
FIG. 11 is a schematic illustration of the glassy carbon lithography stack formed on the semiconductor substrate and the region of thermally-sensitive material according to an embodiment of the present invention.
Figure 12:
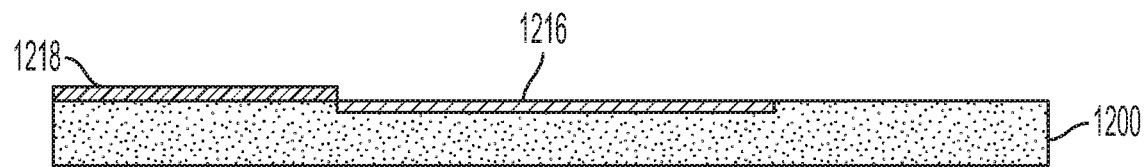
FIG. 12 is a schematic illustration of the semiconductor substrate after the glassy carbon mask has been removed according to an embodiment of the present invention.

According to some embodiments, the process for producing a computing device according to an embodiment of the present invention includes, prior to forming the mask on the semiconductor substrate, forming a region of thermally-sensitive material on said semiconductor substrate. FIG. 10 is a schematic illustration of a region 1018 of thermally-sensitive material formed on the semiconductor substrate 1000. FIG. 11 is a schematic illustration of the glassy carbon lithography stack 1102 formed on the semiconductor substrate 1100 and the region 1118 of thermally-sensitive material. The process may proceed as illustrated in FIGS. 4-9. Because the region of heat-sensitive material is covered by the mask during the laser annealing, the heat sensitive material is not altered by the laser annealing. FIG. 12 is a schematic illustration of the semiconductor substrate 1200 after the glassy carbon mask has been removed. The semiconductor substrate 1200 has a region 1218 of thermally-sensitive material formed thereon, and also includes the annealed doped region 1216 formed therein.

According to some embodiments of the invention, a patterned anneal structure of re-crystallized Si films, i.e., regions of re-crystallized Si material, is combined with regions of original un-altered Si material. A semiconductor substrate may include Si superconductor wires formed in the annealed regions. Dopant may be introduced in the annealed regions but not in other regions.

According to some embodiments of the invention, a process for making a patterned anneal structure of re-crystallized Si (or other material) films enables both annealed and unannealed regions, with doping only in the annealed region.

According to some embodiments of the present invention, a method for producing a computing device includes patterning a glassy carbon mask on the surface of a silicon wafer prior to immersion implant and/or anneal. The glassy carbon is strongly absorbing and will prevent the laser anneal from heating the substrate under the masked region. The anneal will only function in the regions/patterns of the wafer that are not masked by the glassy carbon. Nanosecond anneal times may be used, so only the open Si region is heated to Si melt temperatures.

The glassy carbon is stable at 1000 C and can survive the anneal conditions. The glassy carbon may be formed on a silicon wafer using benzene/H2 CVD deposition, for example. Only 8% film shrinkage during anneal to 900 C enables good adhesion to silicon (higher shrinkage induces stress that can cause adhesion fails). Glassy carbon formed by conventional means of polymer coat and anneal in Ar at 900 C leads to 40% film shrinkage, which can cause the adhesion to fail.

In the past, amorphous carbon layers have been used to assist laser anneal of silicon. These films function as absorbers that transfer heat uniformly to the silicon surface. They are used as a way to maintain uniform heating of a variable Si surface, i.e., a surface that may have oxide, nitride, Si, or other layers present, which would not absorb the laser light uniformly. For these applications, it is desirable that the amorphous carbon be somewhat transparent to the laser light, so some of the light can reach the silicon surface and heat the silicon directly, but the carbon layer can assist in the diffusion of this energy more evenly across the silicon surface. The blanket carbon film does not enable a patterned anneal, only a blanket anneal of the entire chip surface.

In contrast, the glassy carbon mask according to embodiments of the present invention is patterned, and is not a blanket film. It is engineered to strongly absorb the light, preventing it entirely from reaching the Si surface in regions which are not intended for anneal. The patterning allows the carbon mask to be used both as the implant mask and the anneal mask. The glassy carbon mask according to embodiments of the invention can be used for a patterned anneal process in which some regions are selectively annealed while others remain unannealed. An oxide hard mask could be integrated with the implant process, but would result in annealing all portions of the wafer.

According to some embodiments of the invention, a method for producing a computing device includes depositing a glassy carbon stack on wafer, patterning the glassy carbon stack, introducing a dopant using immersion implant, laser annealing the portion of the wafer not covered by the glassy carbon stack, and stripping the glassy carbon stack.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of producing a computing device, comprising:
   providing a semiconductor substrate;
   patterning a mask on said semiconductor substrate, said mask exposing a first portion of said semiconductor substrate and covering a second portion of said semiconductor substrate;
   implanting said first portion of said semiconductor substrate with a dopant; and
   annealing said first portion of said semiconductor substrate to form an annealed doped region, while maintaining said second portion of said semiconductor substrate as an unannealed portion,
   wherein the annealed doped region comprises a superconducting material.

2. The method of producing a computing device according to claim 1, wherein patterning said mask on said semiconductor substrate comprises:
   depositing a layer of mask material on said semiconductor substrate; and
   removing a portion of said layer of mask material to pattern said mask.

3. The method of producing a computing device according to claim 1, wherein said mask comprises glassy carbon.

4. The method of producing a computing device according to claim 1, wherein said semiconductor substrate comprises Si.

5. The method of producing a computing device according to claim 1, wherein said annealed doped region comprises superconducting Si.

6. The method of producing a computing device according to claim 5, wherein said superconducting Si comprises Si implanted with B.

7. The method of producing a computing device according to claim 1, wherein said annealed doped region has a crystalline structure.

8. The method of producing a computing device according to claim 1, wherein annealing said first portion comprises laser annealing said first portion.

9. The method of producing a computing device according to claim 8, wherein said mask absorbs a frequency of a laser used for said laser annealing.

10. The method of producing a computing device according to claim 1, wherein said mask is physically stable at 900° C.

11. The method of producing a computing device according to claim 8, wherein said mask shrinks less than 10% at 900° C.

12. The method of producing a computing device according to claim 1, further comprising, prior to forming said mask on said semiconductor substrate, forming a region of thermally-sensitive material on said semiconductor substrate, wherein patterning said mask comprises covering said region of thermally-sensitive material with said mask.

13. A computing device produced according to the method of claim 1.

14. A computing device, comprising:
a semiconductor substrate, comprising:
an annealed doped region formed in said semiconductor substrate; and
a non-superconducting region in said semiconductor substrate proximal to said annealed doped region,
wherein said annealed doped region has a dopant that is implanted by annealing,
wherein said non-superconducting region has a structure that is unaltered by annealing, and
wherein the annealed doped region comprises a superconducting material.

15. The computing device according to claim 14, wherein said semiconductor substrate comprises Si.

16. The computing device according to claim 14, wherein said annealed doped region comprises superconducting Si.

17. The computing device according to claim 16, wherein said superconducting Si comprises Si implanted with B.

18. The computing device according to claim 14, wherein said annealed doped region has a crystalline structure.

19. The computing device according to claim 14, wherein said non-superconducting region has a crystalline structure.

20. The computing device according to claim 14, further comprising a structure comprising heat-sensitive material formed on a surface of said non-superconducting region.

21. A method of producing a computing device, comprising:
providing a semiconductor substrate;
patterning a mask on said semiconductor substrate, said mask exposing a first portion of said semiconductor substrate and covering a second portion of said semiconductor substrate;
implanting said first portion of said semiconductor substrate with a dopant; and
annealing said first portion of said semiconductor substrate to form an annealed doped region, while maintaining said second portion of said semiconductor substrate as an unannealed portion,
wherein said mask comprises glassy carbon that is stable at 1000° C. and survives conditions of said annealing.

* * * * *